United States Patent [19]

Ishikawa et al.

[11] Patent Number: 5,178,738
[45] Date of Patent: Jan. 12, 1993

[54] ION-BEAM SPUTTERING APPARATUS AND METHOD FOR OPERATING THE SAME

[75] Inventors: Yasushi Ishikawa, Hitachi; Naoya Kanda, Yokosuka; Akio Fujiwara, Tokyo, all of Japan

[73] Assignee: Hitachi, Ltd., Tokyo, Japan

[21] Appl. No.: 698,387

[22] Filed: May 10, 1991

[30] Foreign Application Priority Data

May 10, 1990 [JP] Japan ................... 2-120419

[51] Int. Cl.⁵ .............................. C23C 14/46
[52] U.S. Cl. ..................... 204/192.11; 204/298.04
[58] Field of Search ............ 204/192.11, 192.34, 204/298.04, 298.36; 156/345, 643

[56] References Cited

U.S. PATENT DOCUMENTS 4,793,908 12/1988 Scott et al. ............... 204/192.26

Primary Examiner—Aaron Weisstuch
Attorney, Agent, or Firm—Antonelli, Terry, Stout & Kraus

[57] ABSTRACT

An ion-beam sputtering apparatus using an insulator target and a method for operating the same which is characterized by interposing a conductor film forming process during the ion beam processings using the insulator target. This conductor film formation prevents undesired charge build up on the inside of the apparatus and prevents undesired occurrence of abnormal discharge in the ion beam processing using an insulator as a target.

5 Claims, 1 Drawing Sheet

ION-BEAM SPUTTERING APPARATUS AND METHOD FOR OPERATING THE SAME

BACKGROUND OF THE INVENTION

1. Field of the Invention

This invention generally relates to an improvement of ion-beam sputtering technology, and more particularly to an improvement of an apparatus and a method for performing a sputter deposition using an insulator as a target.

2. Description of the Related Art

Irradiating ions to bombard a target to cause an elastic or inelastic collision with atoms and molecules of a surface of the target for scattering the atoms/molecules or penetrating the irradiated ions into the target is generally called a sputtering process. Sputtering technology includes ion-beam sputtering, direct-current sputtering, and high-frequency sputtering.

Of these sputtering technologies, ion-beam sputtering employs an apparatus which comprises two chambers, i.e., an ion generating chamber where ion-beams are generated and a processing chamber where etching and/or film-forming or deposition is performed by irradiating the ion beams to the target.

The ion generating chamber is maintained at a low level of vacuum of at most $10^{-4}$ Torr and has on its ion beam emitting side a plurality of electrodes through which the ions are emitted. On the other hand, the processing chamber is kept at a high level of vacuum of about $10^{-5}$ Torr. In the processing chamber, a target and a substrate are arranged in position for processing.

With this ion-beam sputtering apparatus, since the processing chamber is maintained at a high level of vacuum as described above, a high-purity thin film can be obtained. And since no negative bias is applied to the target, as opposed to direct-current sputtering, an insulator can be used as the target.

However, when this conventional ion-beam sputtering apparatus is operated to perform ion-beam sputtering for 10 to 20 hours in total, employing as the target an insulator or a material which reacts with a gas in a high vacuum to produce an insulator, sputtered particles expelled from the target by ion beams adhere to all or part of the processing chamber wall surfaces or to all or part of the surfaces of the electrodes in the ion generating chamber, forming an undesired insulator film thereon.

As a result of this, when the surface of the so formed insulator film is subjected to ion irradiation, ions adhere to the film surface. Because the surfaces to which the ions adhere are insulative, the ions will not easily move. This causes local charges on the surface of the insulator film. Likewise the electrodes of the ion generating chamber are charged.

After the sputtering operation is continued for a long time, for example, for 10 or 20 hours, a potential difference between the locally charged portions and the uncharged portions increases, causing local discharge.

As a result, the ion beams might be curved, and the intensity of the ion beam to be irradiated on the target cannot be constant. This varies the processing conditions. The electrodes of the ion generating chamber are also subjected to a similar phenomenon since the electrodes are also covered with insulator film.

In order to solve this problem, after sputtering for about 10 to 20 hours in total, the high vacuum processing chamber is opened to the atmosphere, the wall surfaces of the processing chamber are cleaned, and the electrodes of the ion generating chamber are dismantled and then cleaned for a further operation.

When the conventional technology is used for effecting sputtering of an insulator substance for a long time of about 10 or more hours in total, the processing conditions such as the ion-beam intensity would vary for the reason as mentioned above, unless the cleaning etc. is carried out from time to time. In an etching operation, for example, the depth of the etching can not be constant.

As mentioned above, in order to make the processing conditions constant, the high vacuum processing chamber is opened to the atmosphere every 10 to 20 hours, and the wall surfaces of the processing chamber are cleaned, and further the electrodes of the ion generating chamber are dismantled and cleaned. This, however, lowers the efficiency of the operation.

Further, when the high vacuum processing chamber is opened to the atmosphere, moisture in the air is absorbed by the insulator film formed on the wall surface of the processing chamber. This absorbed moisture is not readily desorbed from the insulator film even after the processing chamber is evacuated. Thus, there is a fear that moisture will then be incorporated into the desired film.

SUMMARY OF THE INVENTION

It is therefore a first object of this invention to provide a method for operating an ion-beam sputtering apparatus which includes a step of sputtering a conductor material after sputtering of an insulator material has been conducted for a long time period. The method of the invention is capable of assuring a stable processing condition, without frequently opening the processing chamber to the atmosphere and cleaning the wall surfaces of the processing chamber or without dismantling and cleaning the electrodes of the ion generating chamber.

A second object of the invention is to provide an ion-beam sputter film-forming apparatus which is capable of assuring a stable processing condition even after the sputtering of an insulator is repeated over a long time period.

A third object of the invention is to provide an ion-beam milling apparatus which is capable of assuring a stable processing condition after the etching of an insulator is repeated over a long time period.

According to a first aspect of the invention, there is provided a method for operating an ion-beam sputtering apparatus for forming an insulator film on a substrate, comprising the step of forming a conductive film on the insulator film formed on interior portions of the ion-beam sputtering film-forming apparatus other than the substrate.

According to a second aspect of the invention, there is provided an ion-beam sputter film-forming apparatus which is composed of a film forming chamber having a target holder, and an ion generating chamber, wherein the target holder is capable of holding a conductive substance and an insulating substance separately and is capable of irradiating ion beams selectively to the conductive substance and the insulating substance.

According to a third aspect of the invention, there is provided an ion-beam milling apparatus comprising a processing chamber having a holder for holding an insulating target substance to be etched, an ion generating chamber, and means for locating a conductor target retractably in front of the insulator target substance on the holder.

Ion beams emitted from the ion generating chamber are irradiated to the insulator target to scatter insulator particles sputtered from the target in a solid angle distribution of 180° according to the sine law. The so scattered insulator particles adhere to the wall of the processing chamber and the electrodes of the ion generating chamber to form films of the insulator material.

However, when an insulator film of several μm is formed on the wall surface of the processing chamber and the electrodes of the ion generating chamber, the ions are attached to the insulator film surfaces when the insulator film surfaces are subjected to ion irradiation. Because the surfaces on which the ions adhere are insulating, the ions cannot easily move, so that the insulator film surface is locally charged. As a result, local discharge occurs between the charged portions and the uncharged portions. Thus, there is a fear that the ion beam will be curved or will be difficult to be emitted. Therefore, the condition of irradiating the ion beams vary with time, and accordingly the processing condition also vary with time.

Then, for example, each time an insulator film of several μm is formed, a target of a conductive material is sputtered to form a conductive thin film of several-hundred Å on the insulator film on the wall surface of the processing chamber and the electrodes of the ion generating chamber.

The inside surface of the ion-beam apparatus will thereby become conductive so that the interior of the ion-beam apparatus can be prevented from being charged, thus enabling a stable process again, without causing any local discharge.

According to this invention, since the sputtering of the insulator can be continued by a simple processing operation in vacuum, it is possible to elongate the cleaning cycle for both the wall surfaces of the processing chamber and the electrodes of the ion generating chamber, thus improving the rate of production.

Further, since it is not necessary to frequently open the processing chamber to the atmosphere, possible changes in the vacuum condition of the processing chamber can be minimized, so that it is not necessary to change the processing condition to cope with the vacuum condition.

BRIEF DESCRIPTION OF THE INVENTION

FIG. 1 is an explanatory view schematically showing an ion-beam sputter film-forming or deposition apparatus according to a first embodiment of this invention; and FIG. 2 is an explanatory view schematically showing an ion-beam milling apparatus according to a second embodiment of the invention.

DETAILED DESCRIPTION OF THE PREFERRED EMBODIMENTS

Embodiments of this invention will now be described with reference to the accompanying drawings.

Figure 1:
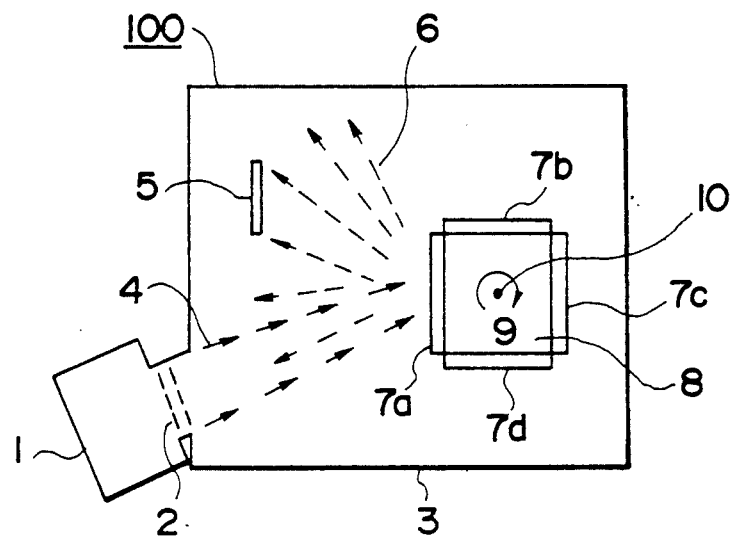

FIG. 1 shows an ion-beam sputter film-forming or deposition apparatus 100 according to a first embodiment of the invention.

The ion-beam sputting film-forming apparatus 100 comprises an ion generating chamber 1 which generates ions to irradiate ion beams 4 to a target (as will be described in detail below) and a processing chamber 3 where a film is to be formed or deposited by sputtering the target using the ion beams 4. The ion generating chamber 1 and electrodes 2 therein may be those of a conventional art, and so their descriptions are omitted here.

A target holder 8 and a substrate 5 are arranged inside the processing chamber 3. The position and structure of the substrate 5 may be substantially identical with those of the conventional art, and so their descriptions are omitted here. The substrate 5 may be conveyed into or out of the processing chamber 3 by a conventional conveyor (not shown), while keeping the processing chamber 3 in vacuum.

A characteristic feature of the invention lies in the position and structure of the target holder 8. The target holder 8 is generally in the shape of a cube having four faces on which targets 7a, 7b, 7c, 7d are respectively disposed. The target holder 8 is mounted on a rotary shaft 10 (illustrated as being perpendicular to the plane of the drawing sheet) so as to be rotated, for example, in the direction of an arrow 9 in FIG. 1. These targets 7a, 7b, 7c, 7d are subjected to sputtering selectively rather than simultaneously. In this embodiment, the target 7d is a conductor, and the remaining targets 7a, 7b, 7c are insulators.

Although the shape of the target holder 8 is generally cubic in the present embodiment as described above, the target holder 8 should by no means be limited to this specific example and may be a different polyhedron. Alternatively, the shape of the target holder may be planar; in this case, the conductor and insulator targets are mounted on the plane and shifted as needed so that ion beams are selectively irradiated to the conductor or the insulators.

The manner in which an insulator film is formed on the substrate by sputtering the insulator or conductor target using the ion-beam sputter film-forming apparatus 100, will now be described.

The ion beams 4 emitted from the ion generating chamber 1 strike the insulator target 7a to disperse the sputtered particles 6 of the insulator at a solid angle of 180° in a sine law distribution. As a result, the sputtered particles are scattered to adhere to the substrate 5 to form a thin film thereon.

Meanwhile, part of the sputtered particles 6 which have not been deposited on the substrate 5 adhere to the wall surface of the processing chamber 3 and the electrodes 2 of the ion generating chamber 1 to form an insulator film on the substrate 5.

After a predetermined lapse of time when a film of a desired thickness has been formed on the substrate 5, a new substrate is conveyed into the processing chamber 3. Thus, a thin film is formed on successive substrates.

However, when an insulator film of about several μm is deposited on the wall surface of the processing chamber 3 and the electrodes 2 of the ion generating chamber 1, a phenomenon described as will be described in detail below occurs. As a result of this, the ion beams 4 are liable to be curved and/or are difficult to be emitted from the electrodes 2. Thus, the processing conditions might vary, and the formed film thickness might vary accordingly.

The phenomenon will now be described. When the sputtering is carried out continuously for a long time, an insulator film of several μm thickness is formed on the substrate and the wall surfaces of the processing chamber 3. Under these conditions, when a portion of the ion beams are irradiated on to the surface, ions are attached to the insulator film surface on the wall surfaces of the processing chamber 3. Since the wall surfaces of the processing chamber 3 are covered with the insulator film, the attached ions cannot easily move so that the surface of the insulator film is charged locally. As a result, local discharges will be caused at many positions of the wall surface of the processing chamber 3.

Likewise, ions are attached to the surface of the insulator films accumulated on the electrodes 2 of the ion generating chamber 1 so that local discharges will occur between the confronting ends of the electrodes 2 which are at different potentials.

To solve this problem, the following operation is performed according to the present embodiment.

Before the insulator film has been deposited to several μm thickness, the target holder 8 is rotated to bring the insulator target 7d to a position to which the ion beams 4 are to be irradiated.

The deposition of the insulator film to a thickness of several μm can be known from, for example, the occurrence of discharge or by measurement with a film thickness meter.

Then the conductor target 7d is brought to a position where it receives the ion beams 4 for sputtering of the conductor material to allow formation of the conductor film of several-hundred Å on the insulator film which has been deposited on the wall surfaces of the processing chamber 3 and the electrodes 2 of the ion generating chamber 1. By this operation, the surfaces which are subjected to the irradiation of the ion beams 4 become conductive and therefore the interior of the ion-beam sputtering film-forming apparatus 100 is prevented from being charged. This again assures a stable sputtering operation.

If the substrate 5 is placed in the processing chamber 3 while the conductor target is subjected to irradiation of the ion beams 4, a conductor film will necessarily be formed on the substrate 5, too. If this is not desired, the substrate 5 is not present in the processing chamber 3 during the sputtering of the conductor material. On the other hand, if it is desired to form a multi-layer film comprising a conductor layer and an insulator layer, several sets of ion sources and targets are prepared and the substrate 5 is introduced into the processing chamber 3 to be subjected to the sputtering of the respective targets. In this case, a composite film of an insulator film and a conductor film can be formed.

According to the present embodiment as described above, a conductor-film forming process may be interposed for about 30 minutes during the insulator film forming to allow the intended insulator-film forming to be conducted stably for a considerably long time, without opening the processing chamber 3 to the atmosphere.

It suffices to clean the processing chamber 3 and the electrodes 2 of the ion generating chamber 1 once every 100 to 200 hours of the processing time according to the present embodiment. In contrast, the cleaning should be done every 10 to 20 hours in the conventional art. Thus it is possible to extend the interval between the cleaning as long as about ten times. This further enables a load-lock substrate exchange system.

Figure 2:
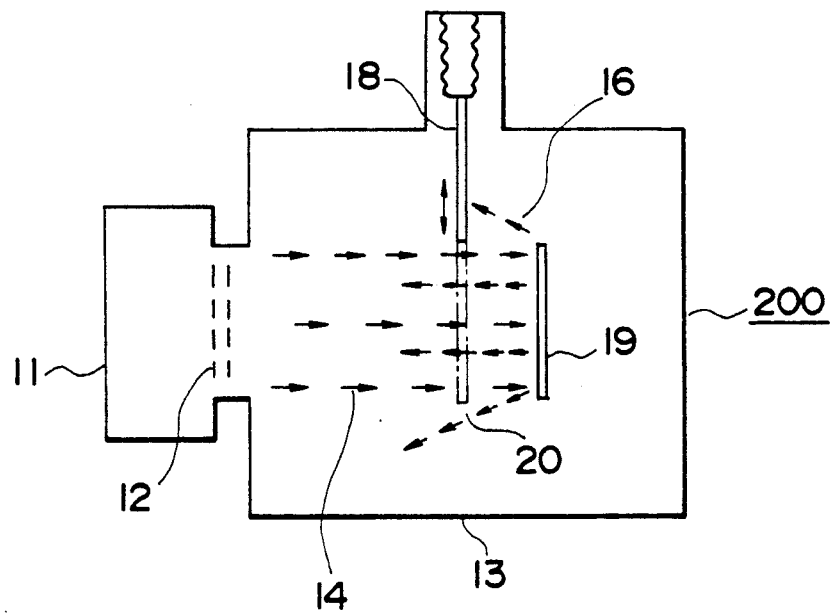

FIG. 2 shows an ion-beam milling apparatus 200 according to a second embodiment of the invention.

The ion-beam milling apparatus 200 comprises two chambers, i.e., an ion generating chamber 11 which generates ions and irradiates ion beams 14 to a processing chamber 13 where a milling process is performed by irradiating a target 19 with the ion beams 14.

The ion generating chamber 11 and electrodes 12 thereof may be those of the conventional art, and so their descriptions are omitted here.

Inside the processing chamber 13 there is a target control means 18 for retractably locating a conductor target in front of the insulator target 19. This target control means 18 includes a bellows 20 which is retractable so as not to block the ion beams 14 while milling of the target 19 by the ion beams 14 is effected, and, if necessary, projectable to a position as shown in a dot-chain line in FIG. 2 to intercept the ion beams 14.

The target 19 is so arranged as to be conveyed into the processing chamber 13 by a conventional conveyor (not illustrated), keeping the processing chamber 13 in vacuum.

An operation for milling the insulating target 19 using the ion-beam milling apparatus 200 will now be described.

The ion beams 14 emitted from the ion generating chamber 11 are irradiated to the insulator target 19 to effect etching of the target 19. Meanwhile insulating sputtered particles 16 are dispersed in a solid angle of 180° in a sine law distribution and, as a result, they adhere to the wall surfaces of the processing chamber 13 and the electrodes 12 of the ion generating chamber 11, forming an insulator film thereon.

After a predetermined time lapse when the target 19 has been etched to a predetermined extent, a new target is conveyed into the chamber 13. Thus successive targets are etched one after another.

However, when an insulator film of about several μm thickness is deposited on the wall surfaces of the processing chamber 13 and the electrodes 12 of the ion generating chamber 11, the same phenomenon occurs as in the first embodiment so that the ion beams 14 might be curved and/or the ion beams 14 might be difficult to be emitted from the ion generating chamber 11. Thus the processing conditions vary, thereby changing the extent of etching of the target 19.

With a view to obviating the problem, the ion-beam milling apparatus 200 is operated as follows:

Before an insulating film of several μm thickness is accumulated on the wall surfaces of the processing chamber 13, the conductor target is brought to such a position as to intercept the ion beams 14.

Then the ion beams 14 are irradiated to the conductor target to allow a conductor film of several-hundred Å to be formed on the insulator film which has been deposited on the wall surfaces of the processing chamber 13 and the electrodes 12 in the ion generating chamber 11.

By this operation, all the interior surfaces become conductive so that the interior of the ion-beam milling apparatus 200 is prevented from being charged, thus assuring a stable operation again.

According to this embodiment, a conducting-film forming process may be performed for about 30 minutes during the milling operation by the ion beams 14 to eliminate the necessity of frequent operating of the processing chamber 13 to the atmosphere and removal of the accumulated insulator films. Therefore, the desired milling is carried out under substantially uniform condition.

Further, the ion-beam milling process of the present embodiment may advantageously be utilized for forming an insulator film pattern of a semiconductor device.

In this case, it is possible to perform the ion-beam milling process under substantially uniform conditions, so that substantially uniform patterns can be obtained continuously.

It suffices to conduct the cleaning of the processing chamber 3 and the electrodes 2 of the ion generating chamber 1 once every 100 to 200 hours of the processing time in this embodiment, whereas it should be done every 10 to 20 hours in the conventional art. Thus, as in the first embodiment, it is possible to realize an about tenfold extension of the time interval between the cleanings.

The target control means 18 which is used in the second embodiment may also employed in the first embodiment in which it serve as a conductor target.

What is claimed is:

1. A method for operating an ion beam sputtering apparatus for forming an insulator film on a substrate by using ion beams, comprising the sequential steps of irradiating ion beams onto a target of an insulator material to sputter insulator particles for depositing the insulator film on the substrate and then forming a conductor film on insulator films which have undesirably formed at portions inside the ion beam sputtering apparatus during the formation of the desired insulator film on the substrate.

2. A method according to claim 1, wherein said conductor film forming step is performed after the insulator films have been deposited in a thickness of the order of several microns.

3. A method according to claim 1, wherein said conductor film forming step is performed while the substrate is not subjected to an ion-beam processing.

4. A method according to claim 1, wherein said conductor film forming step is performed after the interior of the ion beam sputtering apparatus which has been covered with the insulator film is electrically charged.

5. An ion beam milling apparatus comprising a processing chamber having a holder for holding an insulator target substance to be etched and an ion generating chamber, said apparatus further comprising means for increasing a period between required cleanings of the processing chamber for maintaining stable operation including means for retractably locating a conductor target in front of the insulator target substance on said holder so as to enable deposit of conductive material from the conductor on an insulator deposition on interior wall surfaces of the processing chamber and thereby prevent abnormal discharge in the processing chamber.

* * * * *